US009166165B2

(12) United States Patent
Breitwisch et al.

(10) Patent No.: US 9,166,165 B2
(45) Date of Patent: Oct. 20, 2015

(54) UNIFORM CRITICAL DIMENSION SIZE PORE FOR PCRAM APPLICATION

(71) Applicants: International Business Machines Corporation, Armonk, NY (US); Macronix International Co., Ltd., Hsinchu (TW)

(72) Inventors: Matthew J. Breitwisch, Yorktown Heights, NY (US); Roger W. Cheek, Somers, NY (US); Chung H. Lam, Peekskill, NY (US); Hsiang-Lan Lung, Elmsford, NY (US); Eric A. Joseph, White Plains, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/174,777

(22) Filed: Feb. 6, 2014

(65) Prior Publication Data
US 2014/0154862 A1     Jun. 5, 2014

Related U.S. Application Data

(62) Division of application No. 11/620,671, filed on Jan. 7, 2007, now abandoned.

(51) Int. Cl.
*H01L 21/00* (2006.01)
*H01L 45/00* (2006.01)

(52) U.S. Cl.
CPC ............ *H01L 45/1683* (2013.01); *H01L 45/06* (2013.01); *H01L 45/1233* (2013.01); *H01L 45/144* (2013.01); *H01L 45/148* (2013.01)

(58) Field of Classification Search
CPC ... H01L 45/06; H01L 45/1233; H01L 45/144; H01L 45/1683
USPC ................................................. 438/84, 95, 637
See application file for complete search history.

(56) References Cited

U.S. PATENT DOCUMENTS

| | | | | |
|---|---|---|---|---|
| 4,331,708 A * | 5/1982 | Hunter | ........................ | 438/424 |
| 5,814,527 A * | 9/1998 | Wolstenholme et al. | ......... | 438/5 |
| 6,153,890 A * | 11/2000 | Wolstenholme et al. | ......... | 257/3 |
| 6,189,582 B1 | 2/2001 | Reinberg et al. | | |
| 6,420,725 B1 | 7/2002 | Harshfield | ........................ | 257/4 |
| 6,492,656 B2 | 12/2002 | Zahorik et al. | ..................... | 257/3 |
| 6,507,061 B1 | 1/2003 | Hudgens et al. | ................ | 257/295 |
| 6,511,862 B2 | 1/2003 | Hudgens et al. | ................ | 438/95 |
| 6,566,700 B2 | 5/2003 | Xu | ................................. | 257/296 |

(Continued)

FOREIGN PATENT DOCUMENTS

WO    WO/2006/079952    8/2006    ............. H01L 45/00

*Primary Examiner* — Jay C Kim
*Assistant Examiner* — David Chen
(74) *Attorney, Agent, or Firm* — Ido Tuchman; Vazken Alexanian

(57) ABSTRACT

A memory cell and a method of making the same, that includes insulating material deposited on a substrate, a bottom electrode formed within the insulating material, a plurality of insulating layers deposited above the bottom electrode and at least one of which acts as an intermediate insulating layer. A via is defined in the insulating layers above the intermediate insulating layer. A channel is created for etch with a sacrificial spacer. A pore is defined in the intermediate insulating layer. All insulating layers above the intermediate insulating layer are removed, and the entirety of the remaining pore is filled with phase change material. An upper electrode is formed above the phase change material.

8 Claims, 10 Drawing Sheets

(56) References Cited

U.S. PATENT DOCUMENTS

| | | | |
|---|---|---|---|
| 6,764,894 B2 | 7/2004 | Lowrey | 438/238 |
| 6,838,307 B2 | 1/2005 | Gilton | 438/95 |
| 6,849,868 B2 | 2/2005 | Campbell | 257/35 |
| 6,869,841 B2 | 3/2005 | Xu | 438/239 |
| 7,038,231 B2 | 5/2006 | Hart et al. | 257/3 |
| 7,061,005 B2 | 6/2006 | Chang | 257/3 |
| 7,368,802 B2 | 5/2008 | Hayakawa | 257/529 |
| 7,772,581 B2 * | 8/2010 | Lung | 257/3 |
| 2002/0070457 A1 * | 6/2002 | Sun et al. | 257/774 |
| 2003/0072195 A1 | 4/2003 | Mikolajick | 365/200 |
| 2003/0219924 A1 | 11/2003 | Bez et al. | |
| 2004/0037179 A1 | 2/2004 | Lee | 369/47.1 |
| 2004/0113232 A1 | 6/2004 | Johnson et al. | 257/529 |
| 2005/0018526 A1 | 1/2005 | Lee | |
| 2005/0101084 A1 | 5/2005 | Gilton | |
| 2006/0115909 A1 | 6/2006 | Happ | |
| 2006/0118913 A1 | 6/2006 | Yi et al. | |
| 2006/0169968 A1 | 8/2006 | Happ | |
| 2006/0175599 A1 | 8/2006 | Happ | 257/4 |
| 2007/0166981 A1 * | 7/2007 | Furukawa et al. | 438/597 |
| 2007/0246748 A1 * | 10/2007 | Breitwisch et al. | 257/246 |
| 2007/0246766 A1 | 10/2007 | Liu | 257/314 |
| 2008/0090400 A1 * | 4/2008 | Cheek et al. | 438/597 |
| 2008/0138929 A1 * | 6/2008 | Lung | 438/102 |

* cited by examiner

UNIFORM CRITICAL DIMENSION SIZE PORE FOR PCRAM APPLICATION

CROSS-REFERENCE TO RELATED APPLICATIONS

This application is a divisional application claiming benefit under 35 U.S.C. §120 to the filing date of U.S. patent application Ser. No. 11/620,671 filed Jan. 7, 2007, the entire text of which is specifically incorporated by reference herein.

FIELD OF THE INVENTION

The present invention is directed toward computer memory, and more particularly to a non-volatile phase change memory device.

BACKGROUND OF THE INVENTION

There are two major groups in computer memory: non-volatile memory and volatile memory. Constant input of energy in order to retain information is not necessary in non-volatile memory but is required in the volatile memory. Examples of non-volatile memory devices are Read Only Memory, Flash Electrical Erasable Read Only Memory, Ferroelectric Random Access Memory, Magnetic Random Access Memory, and Phase Change Memory. Examples of volatile memory devices include Dynamic Random Access Memory (DRAM) and Static Random Access Memory (SRAM). The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Glass chalcogenides are a group of materials commonly utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

The amorphous and crystalline phases in phase change material are reversible. This is achieved by forming a via lined with insulating material. A lower electrode (also referred to as the source) is formed below the phase change material and an upper electrode (also referred to as the drain) is formed above the phase change material. This allows an electrical pulse to travel through the phase change material when electricity is applied from the source to the drain. Due to ohmic heating, the phase change material changes its phase. A relatively high intensity, short duration current pulse with a quick transition at the trailing edge results in the phase change material melting and cooling quickly. The phase change material does not have the time to form organized crystals, thereby creating an amorphous solid phase. A relatively low intensity, long duration pulse allows the phase change material to heat and slowly cool, thus crystallizing into the crystalline phase. It is possible to adjust the intensity and duration of the pulses to produce a varying degree of resistance for multi-bit storage in a memory cell.

A phase change cell is read by applying a pulse of insufficient strength to program, i.e. to alter the phase of, the material. The resistance of this pulse can then be read as a "1" or "0". The amorphous phase which carries a greater resistance is generally used to represent a binary 0. The crystalline phase which carries a lower resistance can be used to represent a binary 1. In cells where there are varying degrees of resistance, the phases can be used to represent, for example, "00", "01", "10", and "11".

SUMMARY OF THE INVENTION

An exemplary aspect of the invention is a method of forming a memory cell. The method for forming the memory cell begins with standard front end of line (FEOL) wafers generally forming with a plurality of insulating layers over a substrate. A bottom electrode is formed within at least one of the insulating layers. A via is defined by etching through at least one of the insulating layers above the bottom electrode. The via and bottom electrode are separated by at least one intermediate insulating layer. A sacrificial spacer is formed in the via above the intermediate insulating layer. A channel with a smaller diameter than the diameter of the via is defined within the sacrificial spacer walls. A pore is created in the intermediate insulating layer below the sacrificial spacer and above the bottom electrode such that the channel continues through the intermediate insulating layer to the bottom electrode. The sacrificial spacer is then removed and phase change material is deposited into the pore, filling the entire pore. Finally, an upper electrode is deposited above the phase change material.

Another exemplary aspect of the present invention is a memory cell. The memory cell includes a substrate, an insulating layer formed over the substrate, a bottom electrode formed within the insulating layer, a pore in the insulating layer above the bottom electrode, phase change material formed within the pore, with the phase change material filling the entire pore, and an upper electrode formed above the phase change material.

Another exemplary aspect of the present invention is an integrated circuit comprising one or more memory cells with at least one of the memory cells comprising a substrate, an insulating layer formed over the substrate, a bottom electrode formed within the insulating layer, a pore in the insulating layer above the bottom electrode, phase change material formed within the pore, with the phase change material filling the entire pore, and an upper electrode formed above the phase change material. Additionally, the upper electrode may be patterned for bit line connections.

DETAILED DESCRIPTION OF THE INVENTION

Figure 1:
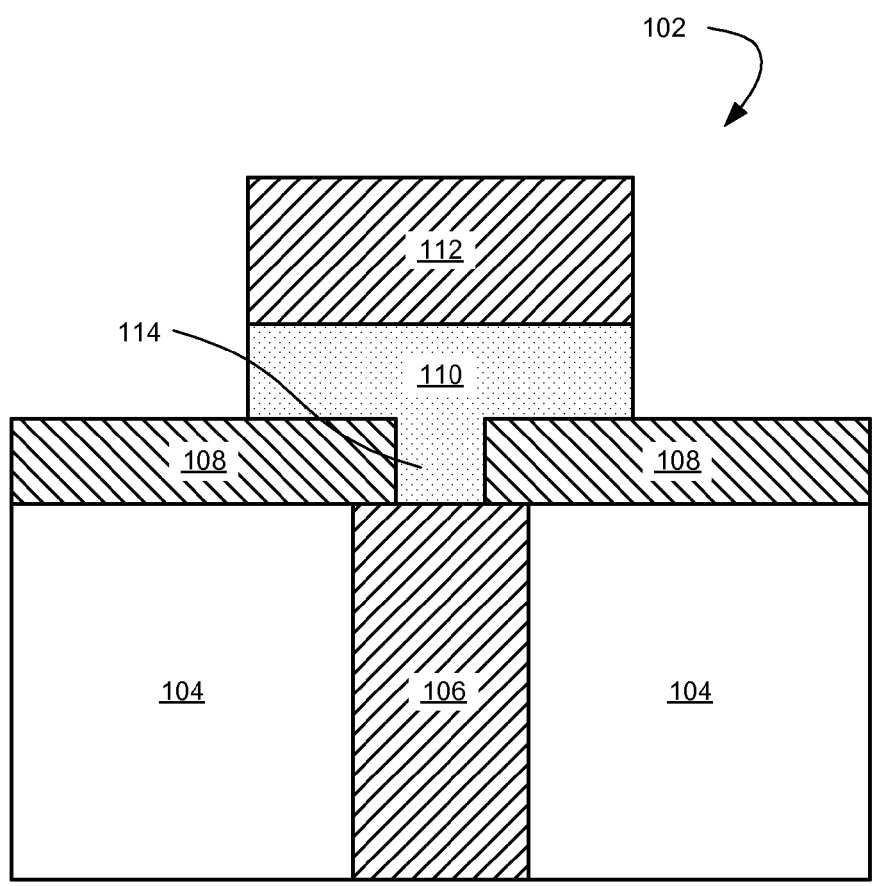
FIG. 1 is a cross sectional view of a memory cell of the present invention.

The present invention is described herein with reference to embodiments of the invention. Throughout the description of the invention reference is made to FIGS. 1-8. When referring to the figures, like structures and elements shown throughout are indicated with like reference numerals.

FIG. 1 illustrates the cross sectional view of an exemplary memory cell 102 contemplated by the present invention. The exemplary memory cell 102 is comprised of an insulating layer 104, a bottom electrode 106, an intermediate insulating layer 108, a pore 114 within the intermediate insulating layer that contains phase change material 110, and an upper electrode 112. The memory cell 102 is typically formed on a substrate with metal-oxide-semiconductor field-effect transistors (MOSFETs) (not shown). Other switching devices known to those skilled in the art, such as junction FETs and bipolar junction transistors, may be used with the present invention.

Figure 2:
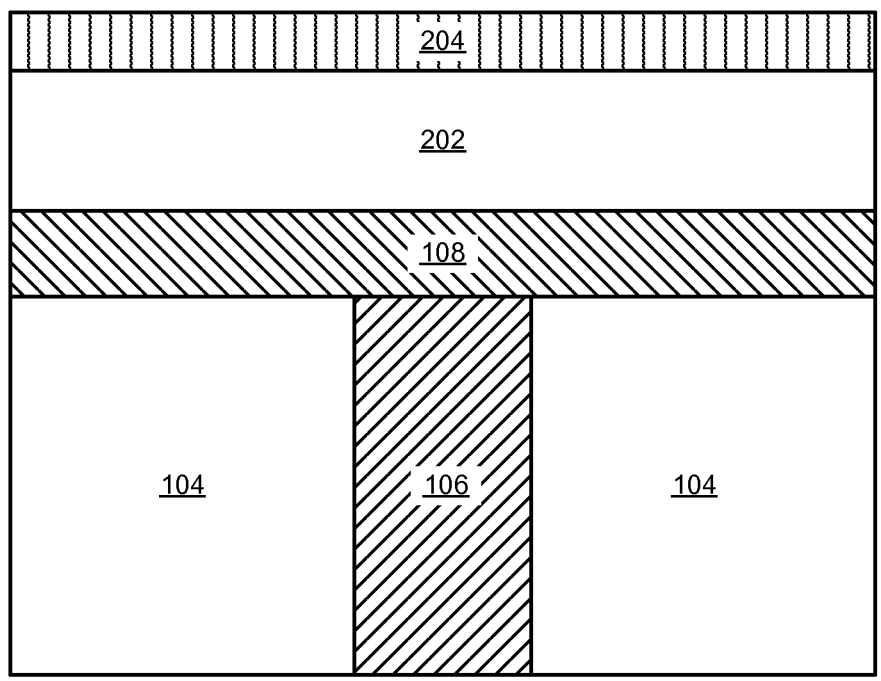
FIG. 2 is a cross sectional view of a FEOL wafer with insulating layers.

In FIG. 2 an exemplary embodiment of a starting front end of line (FEOL) wafer with insulating layer depositions is shown. The exemplary FEOL wafer is comprised of the insulating layer 104. The insulating layer 104 may be composed of, but not limited to, silicon dioxide ($SiO_2$). The bottom electrode 106 may be, but is not limited to, titanium nitride (TiN), tungsten (W), silver (Ag), gold (Au), or aluminum (Al).

In a particular embodiment of the invention, the thickness of the insulating layer 104 and the bottom electrode 106 is greater than 50 nm. The dimension of the bottom electrode is such that its diameter is larger than the diameter of the pore 114 (see FIG. 1) plus tolerance for overlay so that adequate electrical contact is made. In a particular embodiment the diameter of the bottom electrode 106 is at least 80 nm.

Insulating layers disposed above the starting FEOL wafers are the intermediate insulating layer 108, a silicon dioxide layer 202, and an upper insulating layer 204. The intermediate insulating layer 108 may be comprised of, but not limited to, silicon nitride ($SiN_X$). The silicon dioxide layer 202 may also be comprised of, but not limited to, amorphous silicon/poly-silicon (Si), or any material which can be removed selectively to the intermediate insulating layer 108.) The upper insulating layer 204 may also be comprised of silicon nitride. The insulating materials, $SiO_2$ and $SiN_X$, can be formed in one plasma enhanced chemical vapor deposition (PECVD) chamber sequentially or formed separately. In a particular embodiment of the invention, the intermediate insulating layer 108 is approximately 30 nm thick, the silicon dioxide layer 202 approximately 250 nm thick, and the upper insulating layer 204 is approximately 30 nm. It is contemplated that substitute insulating materials may be used for the insulating layer 104 with the present invention, such silicon oxycarbide (SiOC). The intermediate insulating layer 108 and upper insulating layer 204 may also be comprised of alternate insulating materials. An example of alternate insulating materials would be the aforementioned $SiO_2$ and $SiN_X$, aluminum oxide ($Al_2O_3$), tantalum pentoxide ($Ta_2O_5$), etc. Additionally, the $SiO_2$ layer 202 may be comprised of polysilicon/amorphous silicon.

In an alternate embodiment of the starting FEOL wafer with insulating layer deposition, the wafer is comprised of a silicon dioxide insulating layer 104, a bottom electrode 106, an intermediate insulating layer 108, a silicon dioxide layer 202, and an upper insulating layer 204. The bottom electrode 106 may be, but is not limited to, titanium nitride or tungsten. The intermediate insulating layer 108 may be comprised of, but not limited to, $SiN_X$. The silicon dioxide layer 202 may be comprised of, but not limited to, silicon dioxide and may contain any material which can be removed selectively to the intermediate insulating layer. The upper insulating layer 204 may be comprised of, but not limited to, silicon nitride.

Figure 3:
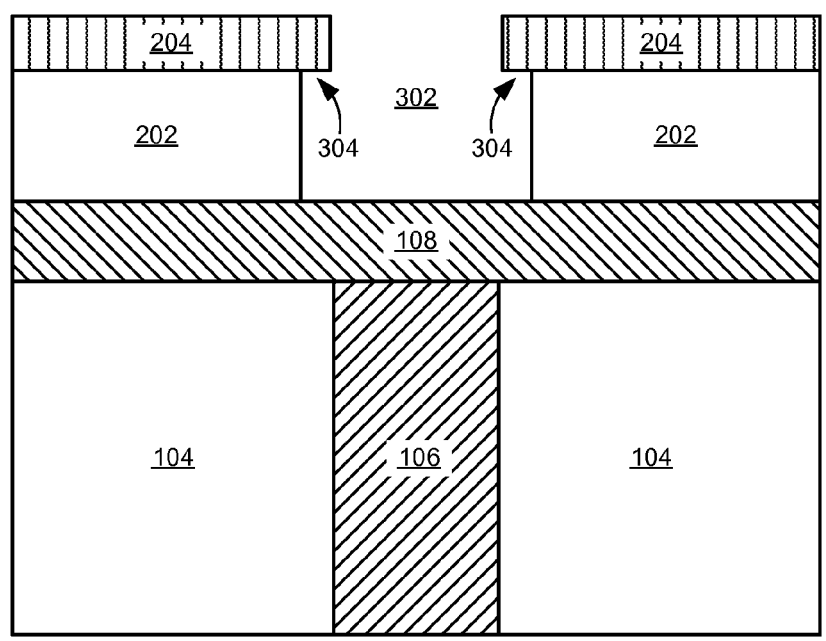
FIG. 3 is a cross sectional view of the creation of a via and undercut in the insulating layers.

Starting with FIG. 2 and turning to FIG. 3, a via 302 is etched into the silicon dioxide layer 202 and upper insulating layer 204. The via 302 stops at the intermediate insulating layer 108. Defining the via 302 can be performed by first forming a lithography mask with photo resist (not shown) above the upper insulating layer 204 and the silicon layer 202. The photo resist is pattern so that the area above the bottom electrode 106 is exposed to the proceeding etch. The etch can then be performed using an anisotropic reactive-ion etch (RIE) process. The photo resist is then stripped from the surface of the upper insulating layer 204. The undercut 304 can be formed by performing a dilute HF wet etch where the HF attacks the silicon dioxide more rapidly than the silicon nitride or amorphous silicon. In a particular embodiment of the invention, the via 302 is approximately 200 nm in diameter and 250 nm in height. The undercut amount 304 is approximately 15 nm per side.

Figure 4:
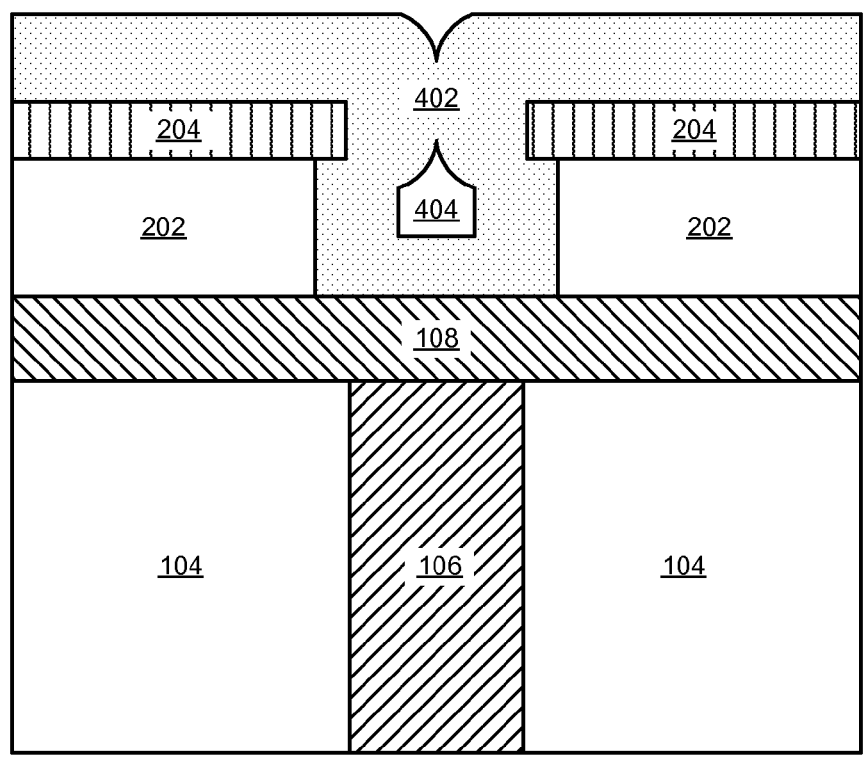
FIG. 4 is a cross sectional view illustrating the deposition of insulating material into the via.

FIG. 4 illustrates the deposition of a conformal insulating layer 402 and a cavity 404 formed therein. In one embodiment of the invention, amorphous silicon is used as the conformal insulating layer 402. The conformal insulating layer 402 can be deposited by chemical vapor deposition (CVD). The thickness of the conformal insulating layer 402 should be greater than the radius of the via 302 in order to create the cavity 404 therein. The size of the undercut 304 in the silicon dioxide layer 202 correlates to the size of the cavity 404 formed within the conformal insulating layer 402. The diameter of the cavity 404 is approximately twice the size of the undercut 304 of the silicon dioxide layer 202. For example, a 30 nm undercut creates a 60 nm diameter cavity 404. Furthermore, the diameter of the cavity 404 will be independent of the diameter of the via 302, providing that the silicon dioxide layer thickness 202 is greater than or equal to a minimum value $H_{min}$. Mathematically, this value can be represented by equation 1 and describes the point at which the cavity dimension is below the triangular pinch-off.

$$H_{min} = r + \sqrt{(2r-\Delta)\Delta} \qquad \text{Eq. 1}$$

Here $H_{min}$ is the silicon dioxide layer thickness 202, $\Delta$ the size of the undercut 304 (half the cavity diameter) and r the radius of the via 302.

In another embodiment however, the diameter of the cavity 404 can be modulated by the profile of the via 302. Specifically, if a controlled taper angle is present in the via, the cavity diameter will decrease according to equation 2, where δ is the effective size of the reduction.

$$\theta = \tan^{-1}\left[\frac{\sqrt{(\Delta-\delta)(2r-(\Delta-\delta))}}{\delta}\right] \qquad \text{Eq. 2}$$

Figure 5:
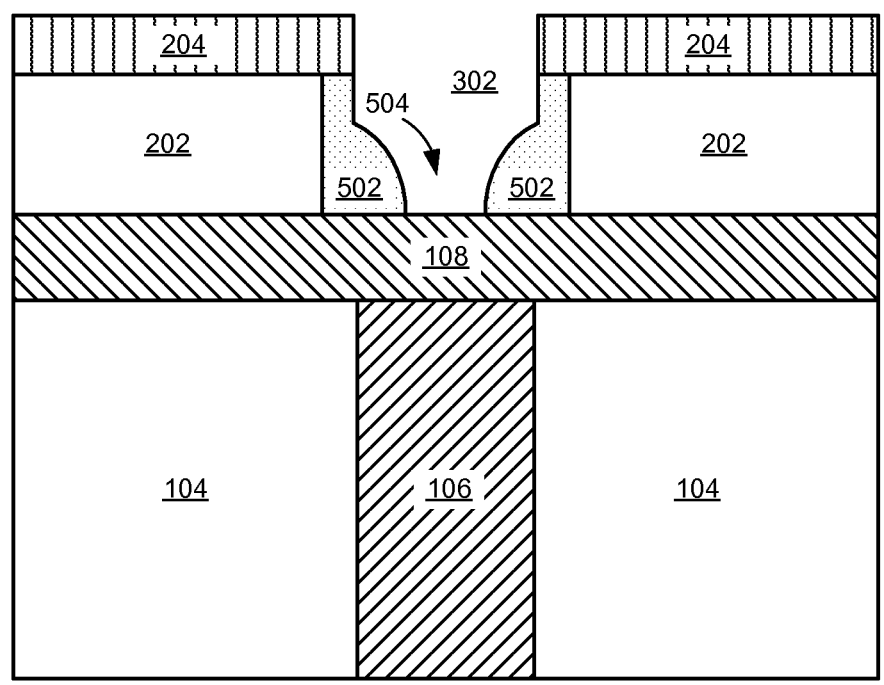
FIG. 5 is a cross sectional view of the creation of a sacrificial spacer.

In FIG. 5, a sacrificial spacer 502 is defined by anisotropic selective reactive-ion etch. The etch removes all of the conformal insulating material above and below the cavity 404 (see FIG. 4) and stops on intermediate insulating layer 108. Additionally, the etch removes the upper insulating layer 204 (see FIG. 4). A channel 504 is created within the sacrificial spacer 502 during this process. The channel allows further etching to be concentrated onto a small region of the intermediate insulating layer 108 above the bottom electrode 106.

Figure 6:
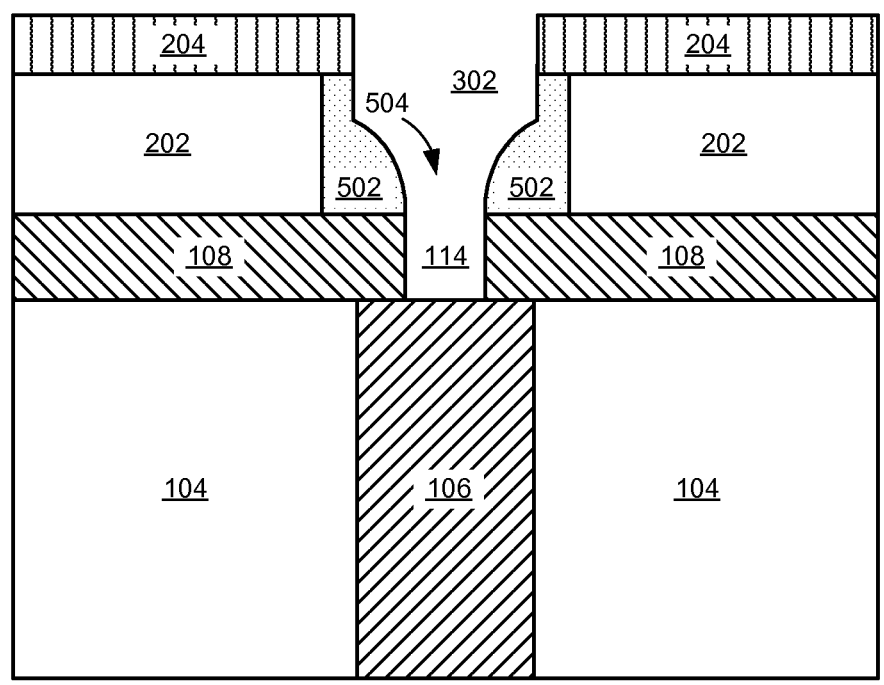
FIG. 6 is a cross sectional view of the creation of a pore.

FIG. 6 shows the process step for defining the pore 114. Defining the pore 114 in the intermediate insulating layer 108 may be performed by a selective and anisotropic reactive ion etch process (to maintain the sacrificial spacer critical dimension) or by a phosphoric acid wet etch (if dimension is not critical). The phosphoric acid etches the channel 504 within the sacrificial spacer 502 into the intermediate insulating layer 108, stopping at the bottom electrode 106. Consequently, if a phosphoric acid wet etch is used, the upper insulating layer 204 is also removed. The resulting radius of the pore 114 is that of the channel 504 and substantially smaller than that of the via 302 (see FIG. 4). Furthermore, the pore radius is substantially uniform throughout. The height of the pore 114 created is that of the thickness of the intermediate insulating layer 108. Additionally, the surface of the pore 114 is substantially planar and perpendicular to the side surfaces of the intermediate insulating layer 108. In a particular embodiment of the invention, the pore 114 is approximately 30 nm in diameter and 30 nm in height.

Figure 7A:
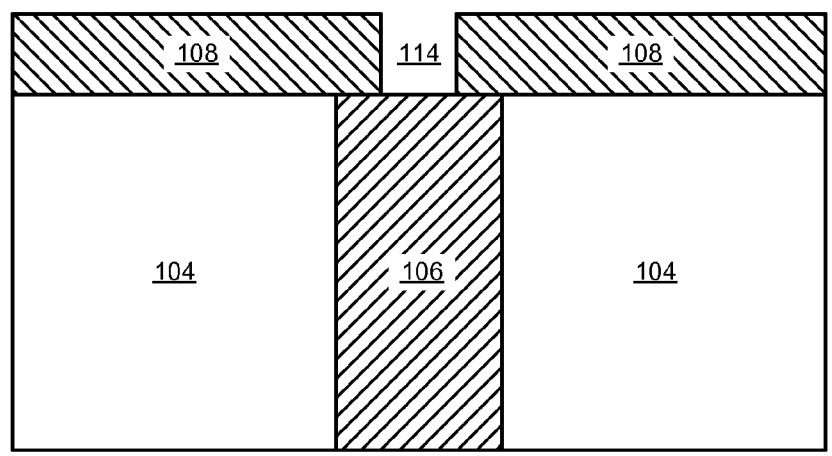
FIGS. 7A and 7B are cross sectional views illustrating the removal of the insulating layer(s).

Illustrated in FIG. 7A is the removal of the sacrificial spacer 502 (see FIG. 6) and the silicon dioxide layer 202. In this exemplary embodiment dilute HF is used to etch the silicon dioxide layer 202. The sacrificial spacer 502 is etched with dilute potassium hydroxide (KOH). In an alternate embodiment, KOH is used to etch the amorphous silicon from the sacrificial spacer 502. Dilute HF is used to etch the $SiO_2$ from the silicon dioxide layer 202. The remaining surface is that of the intermediate insulating layer and that of the top surface of the bottom electrode 106 at the bottom of the pore 114. To ensure that the surface is planar a chemical mechanical polish (CMP) can be performed. Additionally the CMP will remove and excess insulating material above the intermediate insulating layer 108.

Figure 7B:
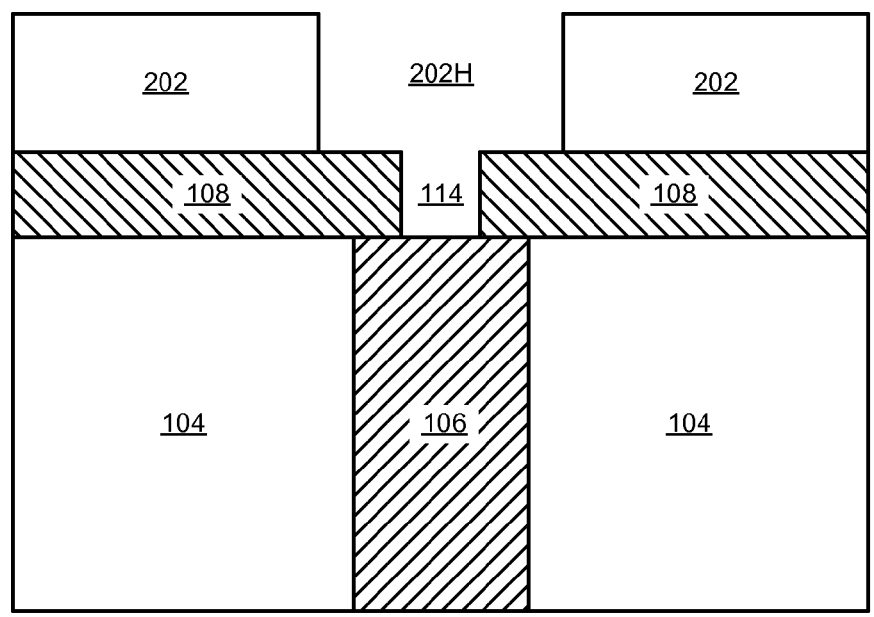

In another alternate embodiment, illustrated in FIG. 7B, the silicon dioxide layer 202 is retained. KOH is used to remove the sacrificial spacer 502 and the dilute HF step is omitted. A channel 202H is created within the silicon dioxide layer 202.

Figure 8A:
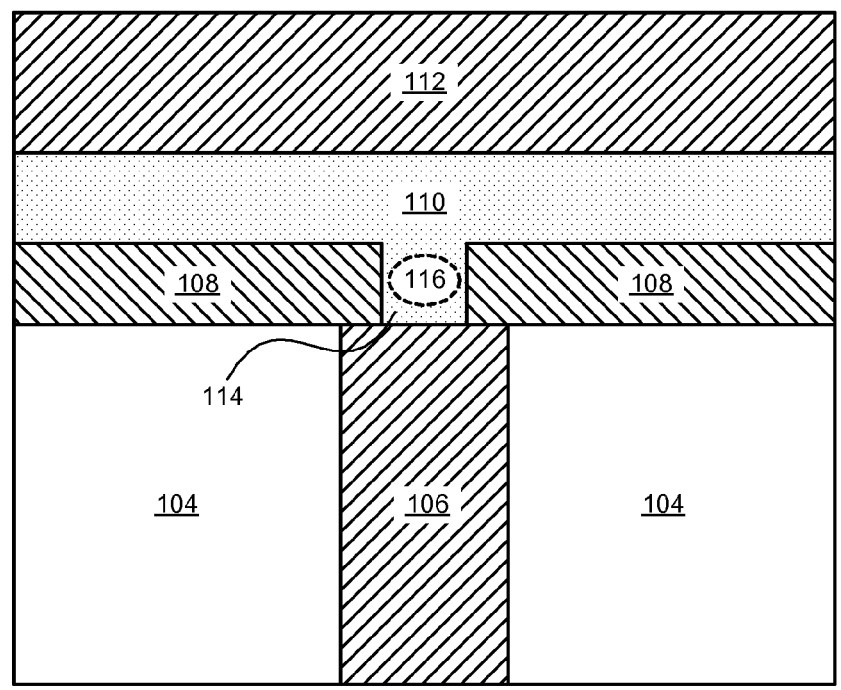
FIGS. 8A and 8B are cross sectional views illustrating the deposition of phase change material and an upper electrode.

In FIG. 8A, the phase change material 110 is deposited above the intermediate insulating layer 108 and filling the entirety of the pore 114. The phase change material 110 can be comprised of a chalcogenide. Chalcogenides are comprised of a chalcogen (Periodic Table Group 16/Group VIA) and a more electropositive element. An example of phase change materials would be GeSb and SbTe. An upper electrode 112 is then formed above the phase change material 110. The upper electrode 112 may be comprised of, but not limited to, silver (Ag), gold (Au), tungsten (W), or aluminum (Al).

In this exemplary embodiment, a phase change region 116 is a region of the phase change material 110 that changes phases. The remaining phase change material 110 above the intermediate insulating layer 108 acts as a conductive passage for an electrical current. This current runs from the bottom electrode 106, to the phase change region 116, through the phase change material 110 and up to the upper electrode 112. It is contemplated that the phase change material 110 and the upper electrode 112 above the intermediate insulating layer 108 and away of the pore 114 may be removed with CMP.

Figure 8B:
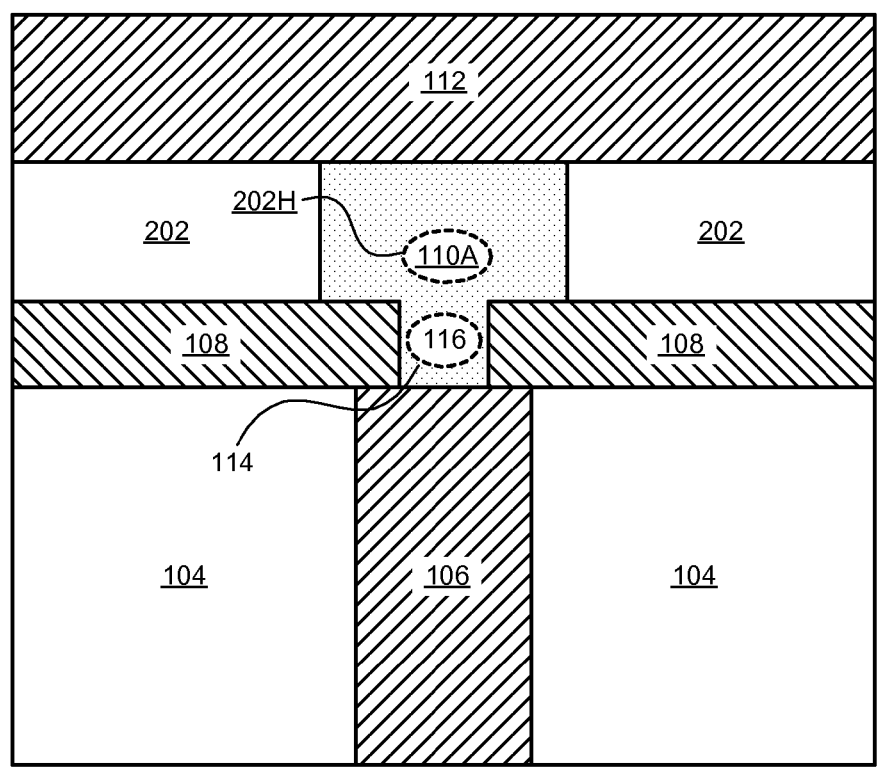

In FIG. 8B, the phase change material 110A is deposited into the channel 202H, within the silicon dioxide layer 202, and into the pore 114. The phase change material 110A fills the entirety of the channel 202H and pore 114. The phase change material within the pore is the phase change region 116. In this alternate embodiment, the phase change material 110A does not require additional etching as explained below.

Returning to FIG. 1, the phase change material 110 of the completed memory cell 102 above the intermediate insulating layer 108 and the upper electrode 112 are patterned for bit line connections. This may be accomplished by forming a lithography mask with photo resist, performing a reactive-ion etch on the regions exposed with the mask, and then stripping the photo resist from the memory cell 102. A Reactive Ion Etching or Ion Milling process can be used to etch the upper electrode 112 and phase-change material 110.

To program the memory cell 102, an electrical pulse is applied beginning at the bottom electrode 106, to phase change region 116, into the phase change material 110 above the intermediate insulating layer 108, and finally up to the upper electrode 112. Ohmic heating created by the resistance heats the phase change material 110 in the phase change region 116 and changes its resistive properties. A short, strong electrical pulse causes the phase change region 116 to heat and cool quickly resulting in an amorphous phase. A long, weaker electrical pulse causes the phase change region 116 to heat and cool slowly, thereby allowing the phase change region 116 to crystallize. The amorphous and crystalline phases exhibit, respectively, higher and lower resistive properties. The stored data can be retrieved by reading the resistance of a particular cell with an electrical pulse that is either too weak or too short to alter the phase in the phase change region 116.

The manufacture of an integrate circuit of cells is achieved by producing the cells in an array so that rows and columns are formed. These cells are then linked together at the FET gates in the MOSFET creating a "word" line. The wiring, used also as the upper electrode 112, is linked together perpendicular to the FET gate linkage creating a "bit" line. This allows each cell to be read or programmed individually by mapping its "word" and "bit" line coordinates.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Having thus described the invention of the present application in detail and by reference to embodiments thereof, it will be apparent that modifications and variations are possible without departing from the scope of the invention defined in the appended claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of That which is claimed is:

1. A method of forming a memory cell, the method comprising:

forming a bottom insulating layer above a substrate;

forming a bottom electrode within the bottom insulating layer;

forming a first intermediate insulating layer above the bottom insulating layer;

forming a second intermediate insulating layer above the first intermediate insulating layer, the second intermediate insulating layer selectively etchable from the first intermediate insulating layer;

forming a top insulating layer above the second intermediate insulating layer;

defining a via through the top insulating layer and the second intermediate insulating layer above the bottom electrode, the via and bottom electrode being separated by the first intermediate insulating layer;

depositing a sacrificial spacer layer within the via, the conformality of deposition of the sacrificial spacer layer being such that a cavity is formed by and is surrounded by the sacrificial spacer layer, the cavity positioned above the first intermediate insulating layer; and etching the sacrificial spacer layer to form a funnel-shaped sacrificial spacer having a curved bottom portion and a vertical top portion above the first intermediate insulating layer, the curved bottom portion is contained entirely within the second intermediate insulating layer and the vertical top portion directly contacts the second intermediate insulating layer and the top insulating layer, the funnel-shaped sacrificial spacer including a channel having a smaller diameter than a diameter of the via;

defining a pore through the first intermediate insulating layer below the funnel-shaped sacrificial spacer and above the bottom electrode such that the channel continues through the first intermediate insulating layer to the bottom electrode;

removing the funnel-shaped sacrificial spacer;

depositing phase change material in the pore, the phase change material filling the entire pore; and forming an upper electrode above the phase change material.

2. The method of claim 1, further comprising forming an undercut in the second intermediate insulating layer, the undercut defining an overhang of the top insulating layer above the via.

3. The method of claim 1, wherein the pore is tubular.

4. The method of claim 1, wherein a wall of the first intermediate insulating layer defining the surface of the pore is substantially planar.

5. The method of claim 1, wherein a side wall of the first intermediate insulating layer defining the pore is substantially perpendicular to an upper surface of the first intermediate insulating layer.

6. The method of claim 1, a diameter of the pore is substantially less than the diameter of the via.

7. The method of claim 1, further comprising:

removing all funnel-shaped sacrificial spacer above the first intermediate insulating layer prior to depositing the phase change material.

8. The method of claim 1, further wherein depositing the sacrificial spacer layer includes surrounding the cavity on all sides by the sacrificial spacer layer.

* * * * *